United States Patent [19]

Fletcher et al.

[11] 4,029,500

[45] June 14, 1977

[54] METHOD OF GROWING COMPOSITES OF THE TYPE EXHIBITING THE SORET EFFECT

[76] Inventors: James C. Fletcher, Administrator of the National Aeronautics and Space Administration, with respect to an invention of; Biliyar N. Bhat, Griffith, Ind.

[22] Filed: Mar. 11, 1975

[21] Appl. No.: 557,565

[52] U.S. Cl. .............................. 75/135; 75/65 R; 75/139; 164/60
[51] Int. Cl.² ........................................ C22C 1/09
[58] Field of Search ............. 75/135, 65 R, 65 ZM, 75/139; 164/58, 59, 60

[56] References Cited

UNITED STATES PATENTS

| 2,739,088 | 3/1956 | Pfann | 75/65 |
| 3,124,452 | 3/1964 | Kraft | 75/135 |
| 3,464,812 | 9/1969 | Utech | 75/65 |
| 3,847,679 | 11/1974 | Livingston | 75/135 |

FOREIGN PATENTS OR APPLICATIONS 948,289   1/1964   United Kingdom ................... 75/65

OTHER PUBLICATIONS

Chadwick, G. A.; Eutectic Alloy Solidification Progress in Materials Science vol. 12, (1963) p. 149.

*Primary Examiner*—L. Dewayne Rutledge
*Assistant Examiner*—Michael L. Lewis
*Attorney, Agent, or Firm*—L. D. Wofford; G. J. Porter; John R. Manning

[57] ABSTRACT

A predetermined amount of segregation is introduced into a molten sample of a composite that exhibits the Soret effect, such amount approximating the amount of segregation resulting from directional solidification of the sample. The molten sample is then directionally solidified starting at the end opposite the end richer in the constituent that would migrate toward the cooler part of a liquid solution of the composite maintained in a temperature gradient. Since solidification commences at the end deficient in such constituent, its migration toward the interface between the solid and liquid during the solidification will compensate for the deficiency yielding a more homogeneous product.

9 Claims, 3 Drawing Figures

METHOD OF GROWING COMPOSITES OF THE TYPE EXHIBITING THE SORET EFFECT

ORIGIN OF THE INVENTION

The invention described herein was made in the performance of work under a NASA contract and is subjected to the provisions of Section 304 of the National Aeronautics and Space Act of 1958, Public Law 85-568 (72 Stat. 435; 42 U.S.C. 2457).

BACKGROUND OF THE INVENTION

This invention relates to a method of growing composites of the type that exhibit the Soret effect so as to improve their structure and homogeneity.

The Soret effect (also referred to as thermotransport) is the difference in concentration of constituents of a liquid solution that occurs in different parts thereof when such parts are at a different temperature. Composites that are influenced by the Soret effect to a relatively large degree are eutectic alloys (binary, ternary or higher) or polyphase alloys with eutectic-like structure. In growing such composites, the so-called Bridgeman method is often used wherein the alloy is melted in a vertically oriented crucible, and then directionally solidified by a process that moves the crucible relative to a furnace. Relative movement is accomplished by lowering the mold containing the alloy into and through the furnace, or by moving the furnace itself in the opposite direction, yielding a more homogeneous product. The crystal may be grown with or without a seed.

In the corresponding horizontal technique, the crucible is horizontally disposed. In both techniques, a temperature gradient is always present at the solid-liquid interface within the crucible. This situation results in the migration of components either toward the interface or away therefrom due to the Soret effect.

The Soret effect is evidenced in composites grown in these ways by non-homogeneity, i.e., variations in the concentration of the constituents from one end of the crystal to the other. Non-homogeneity (also called inhomogeneity) may be expressed as the percent variation in composition along the length of the crystal. Thus, this Soret effect produces a solidification product whose concentration of one constituent in the end of the crystal formed first, (i.e., the end from which growth started) is greater than the concentration of such constituent in the end of the crystal formed last.

In most crystals, this non-uniformity or non-homogeneity in concentration along the length of the crystal is a second order effect that is usually masked by variations in the constituent concentration along the length of the crystal arising from gravity or thermally induced convection currents in the molten portion of the sample undergoing directional solidification. Reference may be made to U.S. Pat. No. 3,464,812 granted on Sept. 2, 1969 to Utech et al which discloses a system for minimizing convection currents in the molten zone during directional solidification where the materials involved have some degree of electrical conductivity in their liquid states. Such system involves applying to the molten zone, a unidirectional, stationary magnetic field in the region where the transition of the material to its solid state is occurring. By making the magnitude of such field sufficiently high, the effective viscosity of the molten zone is significantly increased thus damping thermally induced laminar and turbulent flow and producing a more uniform solidification product.

While the homogeneity of the resultant solid crystal is significantly improved following the techniques proposed by Utech et al, some residual segregation remains due to the Soret effect. For example, consider a liquid eutectic alloy of aluminum and copper (Al-CuAl$_2$), which contains 33% copper by weight and 67% of aluminum, held in a temperature gradient such as would exist across the solid-liquid interface of a sample undergoing directional solidification. Copper is observed to migrate toward the cooler region thereby introducing into the crystal a segregation of copper. The extent of such segregation is dependent upon parameters associated with the directional solidification process. It can be shown that the relative contribution to segregation of copper from the Soret effect, $\eta$, is given by the expression:

$$\eta = (D')(X_2)(G)/(R) \qquad (1)$$

where $D'$ = thermal diffusion coefficient of copper in liquid aluminum at eutectic composition (6.2 $\times$ 10$^{-8}$cm$^2$/sec° C)

$X_2$ = mole fraction of aluminum in the eutectic alloy (0.826)

$G$ = temperature gradient at the solid-liquid interface $R$ = rate of solidification.

If the rate of solidification is one centimeter per hour, and the temperature gradient at the solid-liquid interface is 50° C/cm, then $\eta = 1\%$. Since $D'$ and $X_2$ are constant for an aluminum-copper eutectic, the amount of segregation will depend upon the temperature gradient G and the rate of solidification R, both of which are parameters associated with the growing of a crystal.

As small as the segregation may be due to the Soret effect, it is sometimes still too large for crystals to be used in applications such as eutectic composites used in structural applications; and it is the object of the present invention to provide a new and improved method for minimizing the inhomogeneities in concentrations of constituents arising from the Soret effect, in composites that exhibit this effect, thereby providing a solidification product with improved structure and homogeneity.

SUMMARY OF THE INVENTION

Briefly, the invention involves introducing into a molten sample of a eutectic composite, a predetermined amount of segregation that approximates the amount of segregation resulting from directional solidification, and then directionally solidifying the sample starting at the end opposite the end that is richer in the constituent that migrates toward the cooler part of a liquid solution of the composite maintained in a temperature gradient. Considering the aluminum-copper eutectic alloy discussed above, the ordinary methods of directional solidification result in a crystal whose end that is formed first (i.e., the cooler end of a directionally solidified sample) has more copper than the eutectic composition, and whose end that is formed last (i.e., the hotter end) has more aluminum than the eutectic composition. Following the method of the present invention, this segregation is introduced into a molten sample in one of several ways, and a new crystal is grown by directionally solidifying the molten sample starting at the aluminum rich (i.e., copper deficient) end. Since this end now will be the cooler end during the directional solidification process, the migration of copper toward this end will compensate for the copper deficiency thus achieving a eutectic composition throughout the length of the sample.

BRIEF DESCRIPTION OF THE DRAWINGS

An embodiment of the invention is illustrated in the accompanying drawings wherein.

DESCRIPTION OF THE PREFERRED EMBODIMENT

Figure 1:
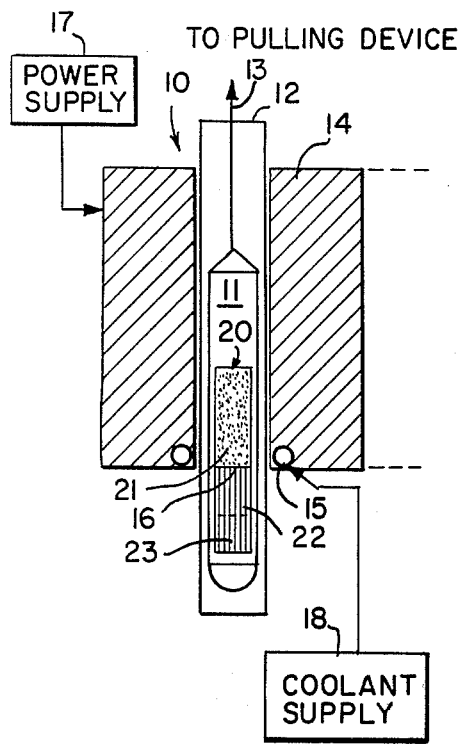
FIG. 1 is a schematic showing of apparatus for directionally solidifying a sample using the Bridgeman technique.
Figure 2:
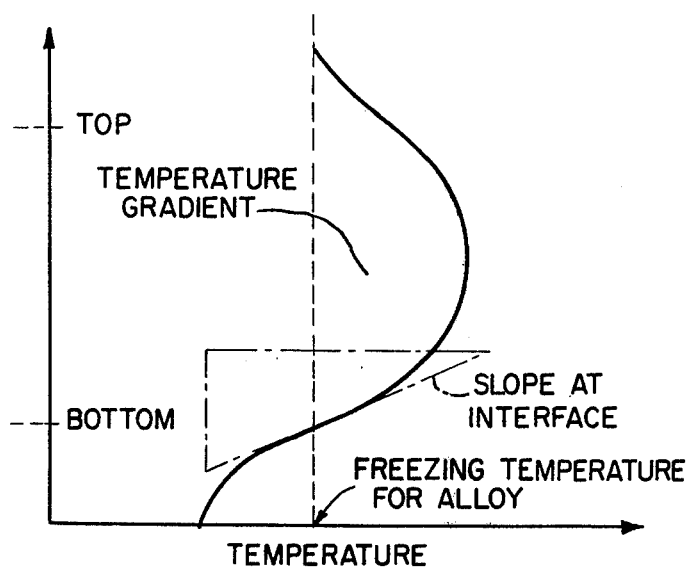
FIG. 2 is a graph showing the variation of temperature with distance in the sample and furnace.

Referring now to FIG. 1, reference numeral 10 represents conventional equipment for growing crystals following the Bridgeman method, including a container 11 mounted for vertical linear movement within a gas-tight chamber 12 by means of a drive 13 connected to a pulling device, a furnace 14 having an induction coil or a resistor (not shown) surrounding the container, and a cooling element 15 adjacent the lower end of the furnace. Container 11 carries a mold 20 containing a composite of the type that exhibits the Soret effect (e.g., a eutectic alloy, or a polyphase alloy with eutectic-like structure). Power supply 17 furnishes electrical power to the coil or resistor of furnace 14 thereby heating the composite in the mold; and a coolant fluid derived from supply 18 is furnished to element 15 for the purpose of locally cooling that portion of the mold opposite element 15. By reason of the heat furnished by the furnace to the composite in the mold, and the localized cooling due to element 15, the temperature within the container varies along its length as suggested by the curve in FIG. 2.

The heat and cooling input to the furnace as well as the position of the mold in the container are adjusted in a known and conventional manner to locate the solid-liquid interface 16 of the composite in the mold at a vertical position where the temperature of the composite is its freezing temperature. Thus, that portion 21 of the composite above the interface is at a higher temperature so that portion 21 is molten; while that portion 22 below the interface is solidified. The rate of change of the position of the mold is adjusted to match the rate at which solidification occurs for the temperature gradient at the interface. Such gradient is the slope of the curve in FIG. 2 at the interface.

If the mold passes the cooling element 15 at the same rate as the rate of solidification, a single crystal will be grown starting at the cooled end (lower end as seen in the drawing). To insure that growth commences with the proper orientation, a seed crystal 23 can be introduced into the mold at this end before starting the crystal growth.

By reason of the temperature gradient in the molten portion 21, adjacent to the solid-liquid interface one or more constituents of the composite will migrate toward the cooler end of the mold, i.e., toward the solid-liquid interface 16 where the crystal is being formed. When the composite is the aluminum-copper aluminum eutectic alloy referred to above, copper will migrate toward the cooler end of the molten portion 21 (i.e., toward the solid-liquid interface). The result is a non-uniform distribution of copper throughout the length of the solidified crystal as suggested by curve A in FIG. 3. As a consequence, the end of sample 24 that was formed first (i.e., the lower end in FIG. 1) is copper rich while the end of the sample formed last is deficient in copper. The inverse, of course, is true of other constituent, aluminum.

The description so far is of a conventional technique which could also be carried out horizontally. Furthermore, the apparatus shown in FIG. 1 is only symbolic as the heating and cooling can be carried out by expedients other than those shown in the drawing and described herein as is well known in the art. Other expedients relating to the type of container and the use of an inert atmosphere therein can be utilized in accordance with known practices for growing various types of composites.

Figure 3:
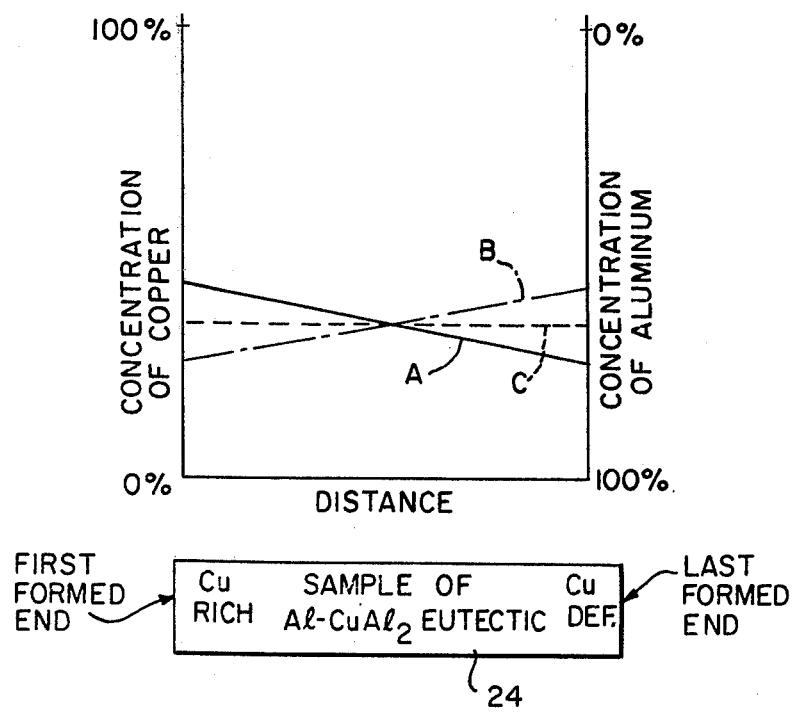
FIG. 3 is a graph that shows the relative concentrations of copper and aluminum as a function of distance along a sample of aluminum-copper eutectic alloy.

It should be understood that the distribution of constituents suggested by curve A in FIG. 3 arises when convection currents in the liquid portion of the composite in the mold are suppressed. Suppression can be achieved to a large extent in a gravity environment by applying to the liquid in the mold, a unidirectional, stationary magnetic field as taught in the Utech et al patent referred to above. Suppression of convection currents is also achieved in a weightless environment such as exists aboard a space station. In the latter environment, where "up" and "down" have no meaning, conventional equipment for carrying out the Bridgeman method can be used in order to take advantage of the improved results achieved by the method of the present invention as described below.

In carrying out the present invention, a predetermined amount of segregation is introduced into a molten sample of the composite. Preferably, such amount approximates the amount of segregation that would result from a directional solidification of the sample. There are a number of ways in which the desired amount of segregation can be introduced into a molten sample. In one approach, the segregation is introduced by holding a molten sample in a predetermined temperature gradient for a predetermined period of time. When a liquid alloy is held in a known temperature gradient G for a given time $t$, the amount of segregation $\Delta c$ resulting thereby is $$\Delta c \, \alpha \, (D')(G)(t)/l \qquad (2)$$

where $l$ is the length of the sample and $D'$ is the thermal defusion coefficient as described above. Where the alloy is an aluminum-aluminum copper eutectic alloy, a variation in the concentration of copper of any desired magnitude can be introduced into a sample merely by holding the alloy in a given temperature gradient for a period of time determined by equation (2). The amount of time, of course, will be determined for each case depending upon the length of the sample, etc.

In order to determine the amount of segregation that should be introduced in this manner, a sample can be directionally in the usual manner and then analyzed for the purpose of experimentally determining the segregation.

Having introduced the proper amount of segregation using the above-mentioned technique and following the requirements dictated by equation (2), one end of the molten sample will be richer in that constituent which migrates toward the cooler part of a liquid solution of the composite while the other end of the molten sample will be deficient in such constituent. The present invention is carried out by directionally solidifying the molten sample starting at the end thereof that is deficient in the constituent which migrates towards the cooler part of a liquid solution of the composite.

Applying this process to the aluminum-aluminum copper eutectic alloy referred to above, directional solidification of the molten sample would start at the end of the sample deficient in copper. In other words, if the segregation introduced into a molten sample using the apparatus shown in FIG. 1 where as shown in curve A in FIG. 3, the next step in the process according to the present invention would be to reverse the direction of the container 11 in the furnace so that the end of the sample that had been hotter would be exposed to the cooling effect of the element 15 and directional solidificatin would commence starting at this end. For the aluminum-aluminum copper eutectic alloy referred to above, the distribution of copper along the length of the boat when the directional solidification process commences is shown by curve B in FIG. 3. That is to say, the solidification begins at the end of the mold that is deficient in copper. As the solidification process occurs, copper migrates toward the solid-liquid interface restoring the copper deficiency so that when the solidification process is completed, the concentration of copper along the length of the sample is uniform as indicated by curve C in FIG. 3.

Instead of reversing the orientation of the container, within the furnace, it is possible to physically move the cooling element 15 to the opposite end of the heating coil and move the mold in the direction opposite to the direction indicated in FIG. 1.

The required amount of segregation can be introduced into a molten sample of the composite in another manner. First of all, a molten sample can be held in a temperature gradient for the required period of time as indicated previously. Then, the sample would be quenched or rapidly solidified in a way that will effectively preserve the concentration gradient during and after solidification. A rate of freezing about ten times the rate of crystal growth would be sufficient to preserve the segregation that had been introduced into the molten sample by reason of the temperature gradient. The solidified sample would then be introduced into the apparatus 10 such that the end that had been hotter during the time the segregation was being introduced thereinto would be adjacent the cooling element 15. When the sample is again melted in the temperature gradient indicated by the curve of FIG. 2, directional solidification can take place with or without a seed crystal being utilized. The results achieved will be the same as previously described and the final solidification product will have a uniform distribution of constituents.

The steps of introducing the predetermined amount of segregation to a molten sample and then directionally solidifying the sample according to the present invention can be carried out in a weightless environment in order to suppress convection currents in the molten portion of the sample. The process according to the present invention can also be carried out in a gravity environment by utilizing the technique disclosed in the Utech et al patent. That is to say, the segregation can be introduced into a molten sample held in the necessary temperature gradient for the necessary period of time in the presence of a unidirectional, stationary magnetic field. A molten sample could be rapidly cooled as described above to preserve the lengthwise variation concentration of the constituents and then remelted in a system that preserves such lengthwise variations, namely in the presence of a unidirectional, stationary magnetic field. Directional solidification starting at the end that had been hotter during the time that the sample was held in a temperature gradient in the molten state would also take place in the presence of a unidirectional, stationary magnetic field.

The present invention is particularly applicable to the production of fiber optics and composite materials since these products involve eutectic alloys or polyphase alloys with eutectic-like structure where a small change in composition results in large differences in physical properties. Furthermore, the present invention appears to be most effective in alloys that exhibit the Soret effect to a large degree. Such alloys are believed to be those whose constituents have one or more of the following properties; significant differences in atomic number, significant differences in ionic size, and significant differences in valence (greater than or equal to one), or any combination of these differences.

What is claimed is:
1. A method for reducing lengthwise constituent concentration variations in a composite of the type exhibiting the Soret effect comprising:
   a. introducing into a molten sample of the composite a predetermined lengthwise variation in the concentration of the constituents of the composite so that the concentration of that constituents which migrates toward the cooler part of a liquid solution of the composite held in a temperature gradient, varies from a higher value at one end of the sample to a lower value at the other end; and
   b. directionally solidifying the molten sample starting at said other end for introducing into the composite a lengthwise constitutent concentration variation that is opposite to the variation present in the composite prior to solidification.

2. A method according to claim 1 wherein the variation in concentration of the constituents is introduced into the molten sample by holding it in a predetermined temperature gradient for a predetermined period of time.

3. A method according to claim 2 including the steps of rapidly quenching the molten sample to preserve the lengthwise variation in the concentration of the constituents; remelting the sample to preserve such lengthwise variation; and directionally solidifying the remelted sample starting at the end that was held at the higher temperature during the step of introducing the lengthwise variation in concentration into the molten sample.

4. A method according to claim 3 wherein the predetermined lengthwise variation in concentration of the constituents matches that which arise out of directional solidification of the sample due to the Soret effect.

5. A method according to claim 1 including the steps of directionally solidifying the sample in a system that minimizes convection currents in the molten zone as solidification proceeds from one end to the other, remelting the sample in a system that minimizes convection currents, and directionally solidifying the remelted sample starting at said other end in a system that minimizes convection currents in the molten zone as solidification proceeds.

6. A method according to claim 1 wherein the process is carried out in a zero gravity environment.

7. A method according to claim 1 including the step of holding the molten portion of the sample in a unidirectional, stationary magnetic field for the purpose of minimizing convection currents in the molten zone.

8. A method according to claim 1 applied to eutectic alloys.

9. A method according to claim 1 wherein the variation in concentration of the constituents is introduced into the molten sample by first directionally solidifying the sample starting at said one end, and then re-melting the entire sample to preserve the lengthwise variation in constituent concentration introduced by the previous directional solidification.

* * * * *